United States Patent
Greiser

(10) Patent No.: US 10,928,468 B2
(45) Date of Patent: Feb. 23, 2021

(54) MR SURFACE COIL

(71) Applicant: Siemens Healthcare GmbH, Erlangen (DE)

(72) Inventor: Andreas Greiser, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/816,578

(22) Filed: Mar. 12, 2020

(65) Prior Publication Data

US 2020/0292641 A1 Sep. 17, 2020

(30) Foreign Application Priority Data

Mar. 14, 2019 (DE) .......................... 102019203472.1

(51) Int. Cl.
*G01R 33/341* (2006.01)
*G01R 33/34* (2006.01)

(52) U.S. Cl.
CPC ..... *G01R 33/341* (2013.01); *G01R 33/34084* (2013.01)

(58) Field of Classification Search
CPC .. G01R 33/341; G01R 33/34084; A61B 5/055
See application file for complete search history.

(56) References Cited

U.S. PATENT DOCUMENTS

| 2003/0016015 A1* | 1/2003 | Eggers | G01R 33/341 324/307 |
| 2008/0007259 A1* | 1/2008 | Driemel | G01R 33/3415 324/260 |
| 2010/0095762 A1 | 4/2010 | Despesse | |
| 2013/0162252 A1* | 6/2013 | Heid | G01R 33/34084 324/318 |
| 2016/0238677 A1 | 8/2016 | Fischer | |

FOREIGN PATENT DOCUMENTS

DE 102010023844 A1 12/2011
KR 20160101698 A 8/2016

OTHER PUBLICATIONS

German Office Action for German Application No. 10 2019 203 472.1 dated Feb. 10, 2020, with English translation.
German Office Action for German Application No. 10 2019 203 472.1 dated Mar. 2, 2020, with English translation.
German Decision to Grant for German Application No. 0 2019 203 472.1 dated Mar. 13, 2020, with English translation.
German Office Action for German Application No. 10 2019 203 472.1 dated Feb. 10, 2020.

* cited by examiner

*Primary Examiner* — Rishi R Patel
(74) *Attorney, Agent, or Firm* — Lempia Summerfield Katz LLC

(57) ABSTRACT

At least one adjustable stiffening device is integrated into a mechanically flexible MR surface coil. The stiffening device can have, in particular, at least one stiffening volume including magnetorheological, electrorheological or thermorheological material. The stiffening device extends at least in one surface direction of the MR surface coil. The MR surface coils positioned on limbs, such as wrapping around, and are stiffened.

12 Claims, 2 Drawing Sheets

MR SURFACE COIL

RELATED CASE

This application claims the benefit of DE 102019203472.1, filed on Mar. 14, 2019, which is hereby incorporated by reference in its entirety.

FIELD

The present embodiments relate to a mechanically flexible body or surface coil for use in magnetic resonance tomography ("MR surface coil"). The embodiments can be applied, for example, to MR surface coils for positioning on limbs.

BACKGROUND

Mechanically flexible MR surface coils are offered by different manufacturers. These MR surface coils have, for example, a cover-type base form, in which mechanically flexible or flexible MR individual coils are accommodated in a textile sleeve and which is therefore also flexible overall, (e.g. also foldable, etc.). Upon placement, flexible MR surface coils can therefore be adjusted flexibly to a body to be examined. During an MR measurement, the MR surface coils should, however, also be as stable as possible, for instance if the coils are to be wound around the limbs of a patient. The stability may be provided by mounting bands, such as belts or Velcro, attached to the outside.

The use of mounting bands for the precise positioning of the flexible MR surface coils is however comparatively complex in respect of the workflow and setup required for this purpose. The MR surface coils can also slip out of place during an MR measurement.

SUMMARY AND DETAILED DESCRIPTION

It is the object to at least partially overcome the disadvantages of the prior art and in particular to provide a possibility of attaching flexible MR surface coils in a positionally accurate fashion to the body to be examined in a particularly simple and effective manner so that the flexible coils remain as stable as possible during an MR measurement.

The object is achieved by a mechanically flexible MR surface coil, wherein at least one adjustable stiffening device is integrated into the MR surface coil. While the MR surface coil itself remains flexible when a conventional MR surface coil is locked into position using mounting bands, the stiffening device enables a targeted stiffening or reduction in the flexibility of the MR surface coil. As a result, it is possible to dispense with locking the MR surface coil into position using mounting bands ("beltless MR surface coil") or prevent the MR surface coil from slipping out of place in particular also outside of or in addition to the mounting bands.

The embodiment as an adjustable stiffening device includes in particular that the stiffness of the stiffening device can be purposefully adjusted by an external entity (e.g. operator and/or automatically by an MR system). The MR surface can therefore optionally be left in a mechanically more flexible state or stiffened by the stiffening device.

This in turn enables a particularly precise arrangement of the MR surface coil on a body to be examined, e.g. because after stiffening it can no longer slip off from the corresponding body part or only to a lesser extent. As a result, the probability of slipping during an MR measurement is advantageously also reduced. Furthermore, the operator requires less time to attach the MR surface coil to a body to be examined than when it is fastened using mounting bands; this improves the effectiveness of the workflow.

In one development, the stiffening device is integrated into the MR surface coil. The advantage is therefore achieved in that the MR surface coil can further be placed easily, in particular on both sides. A stiffening of the stiffening device can also be transformed particularly effectively into a stiffening of the MR surface coil as such. This development can include, in particular, that the stiffening device, if applicable except for supply lines or actuation or operating elements, is completely surrounded by the sleeve consisting of textile, for instance, or the casing of the MR surface coil.

In one development, the stiffening device has two adjustable levels of stiffness, e.g. flexible and stiff. Alternatively, the stiffening device can have more than two levels of stiffness e.g. flexible/average/stiff. This can further simplify a procedure for applying the MR surface coil and thus make it more effective. Alternatively, the stiffness of the stiffening device can be adjusted gradually, in particular between two end values. Stiffness can be understood in particular to mean a bending stiffness.

In one embodiment, the stiffening device has at least one stiffening volume made from magnetorheological material that extends at least in one surface direction of the MR surface coil. The advantage is therefore achieved in that the stiffening can be achieved particularly easily by applying a magnetic field to the magnetorheological material.

A stiffening volume can then be understood in particular to be a volume that has the magnetorheological material. The magnetorheological material can be surrounded by a slightly flexible sleeve or casing, which consists in particular of non-magnetic material such as plastic film etc. The stiffening volume can also be considered to be a stiffening element filled with magnetorheological material.

The stiffening device can have one or more stiffening volumes.

A surface direction can be understood to be, in particular, a direction along the surface, plane or flat side of the typically thin MR surface coil. For instance, the stiffening volume may be an elongated, in particular also straight volume when extended in just one surface direction. However, the form of the stiffening volume is not limited and can, in particular, be shaped arbitrarily in the plane or surface of the MR surface coil, e.g. as an elongated strip, as a number of strips which run parallel to one another and/or obliquely, in the shape of a comb, grid, ring, rectangle or with a free shape.

In one development, the magnetorheological material is a magnetorheological liquid and/or a magnetorheological elastomer material, e.g. a suspension of magnetically polarizable particles (e.g. carbonyl iron powder), which are finely distributed in a carrier liquid or in an elastomer matrix.

In one embodiment, the stiffening device has at least one activable magnetic field generation device for generating a magnetic field at the site of the magnetorheological material for stiffening the same. The advantage is achieved in that the stiffening of the magnetorheological material can be achieved particularly reliably. A magnetic field generation device can have one or more magnets, in particular one or more electric coils. The use of electric coils is advantageous in that, contrary to permanent magnets, they can be switched off and moreover in one development the degree of stiffness of the magnetorheological material can be adjusted gradually by way of the current routed into the coil(s). The activation of the magnetic field generation device therefore includes in particular a current supply to at least one electric coil, which thereupon generates a magnetic field at the site of the magnetorheological material. In order to supply current to the at least one electric coil, corresponding power supply lines can be led through out of the MR surface coil.

In one embodiment, the at least one electric coil used for stiffening the stiffening volume is a dedicated electric coil, in other words has no further function. In one development, the at least one electric coil used to stiffen the stiffening volume is at least one MR individual coil of the MR surface coil.

In one advantageous embodiment for achieving a structurally, particularly easily, configurable stiffening device, the stiffening device is designed "without an excitation element", i.e. has itself no magnetic field generation device. The magnetorheological material can then be stiffened e.g. by the basic field or B0 field of an MR system or MR scanner. The magnetic field triggering the stiffening is therefore an externally generated magnetic field in respect of the MR surface coil and irradiates the MR surface coil. This embodiment is advantageous in that no additional infrastructure is required e.g. for the power supply or signal transmission and a user does not need to actively trigger or set the stiffening or hardening.

In one embodiment the stiffening device has at least one stiffening volume, including electrorheological material, which extends at least in one surface direction of the surface coil and at least one voltage supply device for applying an electrical voltage at the site of the magnetorheological material in order to stiffen the same. A, in one variant gradually adjustable, reliable stiffening of the MR surface coil can be achieved with structurally particularly simple devices. The stiffening volume can also be considered to be a stiffening element filled with electrorheological material. The voltage supply device can for instance have two or more electrical contacts which are distanced from one another and that are in contact with the electrorheological material and that can be applied with an electric voltage, in particular, by an outwardly guided electric supply line. In one development, the electrorheological material is an electrorheological liquid, e.g. an aluminum salt of stearic acid, based on polymer particles, etc.

In one embodiment, the stiffening device has at least one stiffening volume, including thermorheological material, which is extended at least in one surface direction of the surface coil. It is therefore advantageous that a stiffening can also be achieved by heat input; this can be achieved particularly advantageously without generating magnetic fields. The stiffening volume can also be considered to be a stiffening element filled with thermorheological material.

In one embodiment, the stiffening device has at least one heating device (heat source) for heating the thermorheological material in order to stiffen the same. This enables a particularly reliable stiffening. The heating device can be a resistance heating element, for instance.

In one embodiment, the stiffening device is embodied without a heat source, in other words itself has no heating device. Therefore, a stiffening device of a particularly simple structure can be provided. The heat required for stiffening can be provided by an external IR source, for instance, e.g. an IR emitter.

In one embodiment, at a normal surface temperature of the skin of a human (approx. 32° C. to 34° C.), the thermorheological material indicates a noticeable stiffening compared with at room temperature (typically no more than 25° C.). The advantage is achieved in that when applied to a human body the MR surface coil stiffens on account of the heat output through the patient's skin. A further device for introducing heat into the stiffening volume need not be provided but can be provided.

The above stiffening device can therefore generally have at least one excitation device (magnetic field generation device, voltage supply device, heating device) for stiffening a corresponding rheological material.

In one development, at least one stiffening volume has at least one dielectric elastomer material as a stiffening material.

In one embodiment, the stiffening device has a number of fixed elements, which can optionally be moved and locked in position relative to one another. Advantageously a particularly stable stiffening device can therefore be provided. The stiffening device can be adjusted, in particular, in that the fixed (i.e. not bendable or permanently stiff) elements are either moveable relative to one another, in particular also rotatable or are locked into position relative to one another.

In one embodiment, the fixed elements can be mechanically locked into position relative to one another, for instance by mechanical wedging. In one development, the stiffening device has a flexible shaft, wherein the fixed elements are mechanically locked into position relative to one another by rotating the shaft, e.g. at right angles to a bending direction by wedging. The rotation of the shaft can be implemented for instance by a lever or by a suitable electric or pneumatic drive.

The fixed elements of the stiffening device can be arranged in series, for instance.

In one development the fixed elements are magnets, which can be moved relative to one another, in particular rotated, and which upon entry into the B0 field of the MR scanner displace and are thus locked into their position. The procedure of locking into position can be achieved by a force fit and/or form fit.

In one embodiment, the stiffening device has a number of elements, which can be moved relative to one another using actuators or motors. A particularly carefully targeted deformation of the MR surface coil can be adjusted. For instance, an active "robotic" deformation of the MR surface coil can be provided. Here, the mutually movable elements can be closed and opened, in particular, in a similar manner to a hand of a robot. An adaptation of the MR surface coil to the body can take place automatically (e.g. on the basis of body data of the patient) and/or integrated sensors can stop the deformation as soon as a target shape and/or a resistance is reached.

BRIEF DESCRIPTION OF THE DRAWINGS

The above-described characteristics, features and advantages of this invention, as well as the manner in which these are realized, will become more clearly and easily intelligible in connection with the following schematic description of exemplary embodiments which are explained in more detail with reference to the drawings. For clarity of illustration identical elements, or elements having an identical effect, can be given identical reference characters.

DETAILED DESCRIPTION OF THE DRAWINGS

Figure 1:
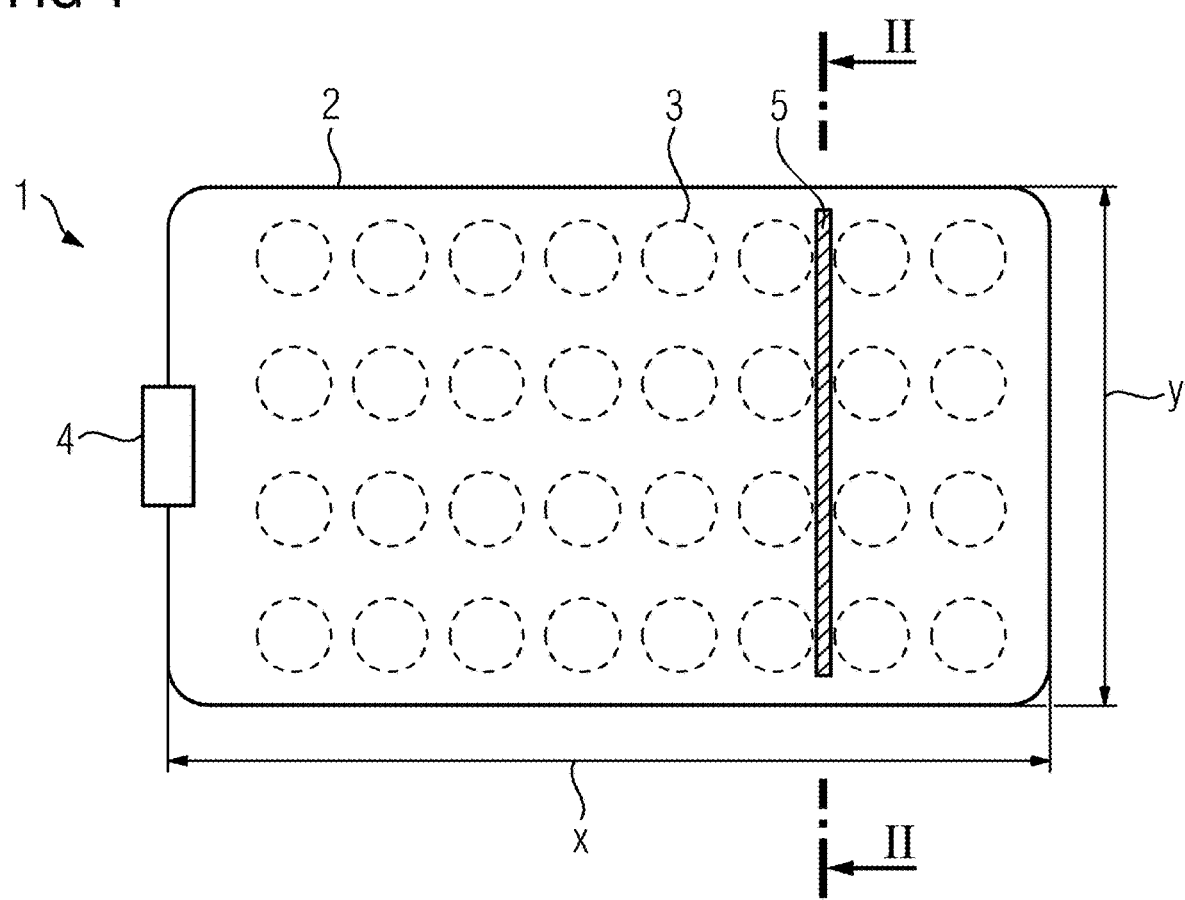
FIG. 1 shows a top view of an MR surface coil 1 according to a first exemplary embodiment.
Figure 2:
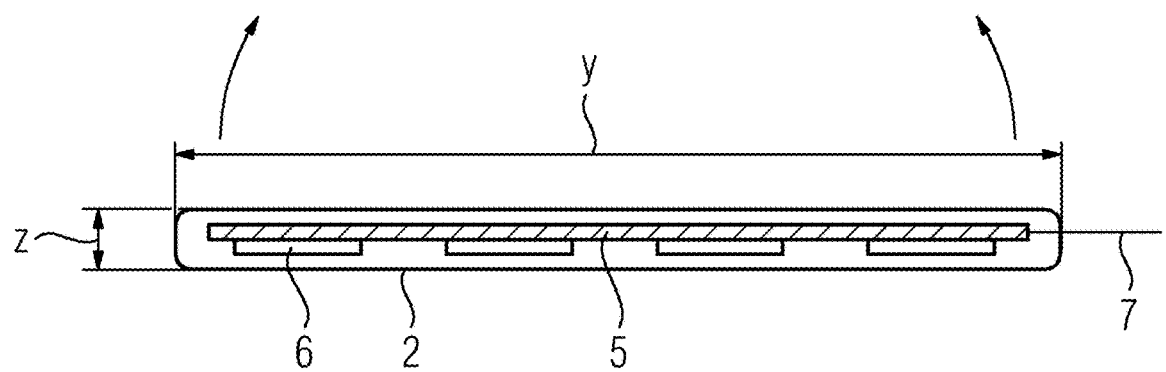
FIG. 2 shows the surface coil 1 according to the first exemplary embodiment as a sectional representation in a front view.

FIG. 1 shows a top view of a drawing of a cover-type MR surface coil 1 on a surface or plane according to a flat side. FIG. 2 shows the surface coil 1 as a sectional representation in a front view on the sectional plane II-II indicated in FIG. 1.

The surface directions of the flat side correspond to an x-axis and a y-axis. A thickness along a z-axis is noticeably smaller, in particular by at least one order of magnitude smaller, than the extent of the MR surface coil 1 along its surface directions.

The MR surface coil 1 has a flexible (outer) sleeve 2, in particular made from textile, in which a number of flexible MR individual coils 3 are located. The MR individual coils 3 can be transmit and/or receive coils. The MR individual coils 3 can be coupled to an MR system for data and supply purposes by way of a signal terminal 4. This MR surface coil 1 is flexible under the effect of gravity so that it fits snugly on a body to be examined when applied thereto.

In addition to conventional MR surface coils, the MR surface coil 1 has a stiffening device 5. The stiffening device 5 is molded in a straight elongated manner with a flat MR surface coil 1 here and is aligned along the y-axis. The stiffening device 5 can be stiffened and unstiffened in a targeted manner, wherein in the flexible state it does not, or not significantly, increase the bending stiffness of the MR surface coil 1 about the x-axis, but in the stiffened state, it noticeably increases the bending stiffness of the MR surface coil 1 about the x-axis, in particular to such an extent that in the region of the stiffening device 5 the MR surface coil 1 no longer bends under gravity.

The stiffening device 5 can for instance have a sleeve or casing filled with magnetorheological material, electrorheological material and/or thermorheological material as a stiffening volume. The stiffening device 5 can be sewed to the sleeve 2.

In one development, the stiffening device 5 has at least one excitation device 6, during the actuation or activation of which the stiffening volume stiffens. After interrupting the actuation or after deactivation, the stiffening volume goes back to its flexible state, possibly after a delay. Depending on the type of stiffening volume, the at least one excitation device 6 can be, for instance, a magnetic field generation device (in particular with one or more electric magnets), a voltage supply device or a heating device with at least one electrically operated heat source. In one development, the magnetic field generation device can use the MR individual coils 3 as excitation devices 6, at least until the stiffening device 5 is penetrated by the B0 field of an MR scanner.

In the event that the stiffening volume has magnetorheological material or thermorheological material, the stiffening device can also be designed without an excitation element, i.e. no excitation devices 6. The stiffening of the magnetorheological material can then take place by the B0 field of the MR scanner. The stiffening of the thermorheological material can take place for instance by irradiation with an external IR emitter or by heating upon contact with the skin of a patient.

Alternatively or in addition to the embodiment of the stiffening device 5 with material-filled rheological stiffening volumes, it can have a number of fixed or permanently stiff elements (not shown) arranged here in series along the y-axis, which can be rotated or pivoted at least about the x-axis. The stiff elements can be connected to one another by way of hinges. In one development, a shaft (not shown) which can be rotated about its longitudinal axis can be present along the series of the fixed elements. By rotating the shaft about its longitudinal axis, the fixed elements can wedge and as result mechanically lock into position relative to one another. By rotating the shaft in the other direction, the wedging can be cancelled again.

Alternatively or in addition, the fixed elements can be magnets that can be moved relative to one another and that can be displaced relative to one another when a magnetic field (e.g. a magnetic field generation device and/or the B0 field) is applied and as a result can be connected to one another in a force and/or form-fit manner.

It is also possible for the stiffening device 5 to have a number of elements, which can move relative to one another using actuators or motors, in particular can rotate or pivot relative to one another, and which are in particular themselves permanently stiff.

The signals for actuating the excitation device 6 (e.g. an electric voltage or an electric current) can be provided e.g. by way of the signal terminal 4 and/or by dedicated electric lines 7.

Figure 3:
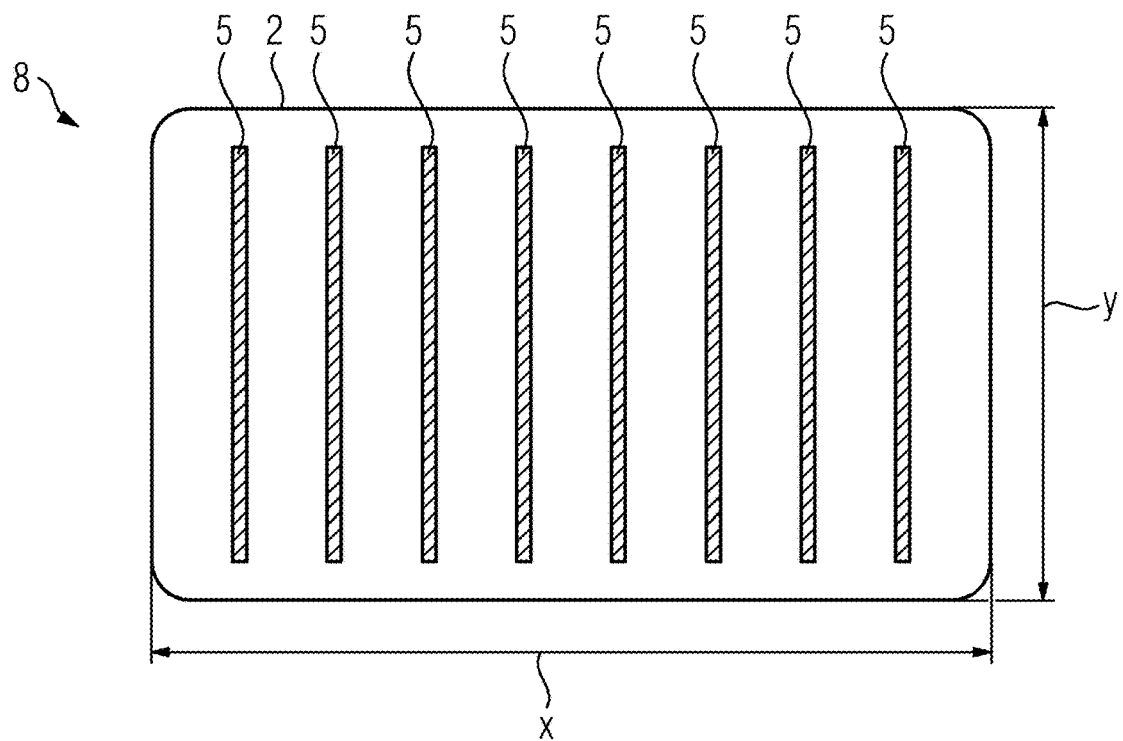
FIG. 3 shows a top view of an MR surface coil 1 according to a second exemplary embodiment.

FIG. 3 shows a top view of a drawing of an MR surface coil 8 according to a second exemplary embodiment shown in a simplified diagram without showing the MR individual coils 3, signal terminal 4, and excitation device 6. The MR surface coil 8 now has a number of stiffening devices 5 of the MR surface coil 1 that are in a parallel arrangement relative to one another. This makes it possible to purposefully hamper or even practically entirely prevent the MR surface coil 8 from bending about its x-axis (as indicated in FIG. 2 by the curved arrow). A flexibility of the MR surface coil 8 about the y-axis is conversely retained.

Alternatively, the stiffening devices 5 can also be aligned parallel to one another in the x-direction, run obliquely parallel to one another or be aligned angled relative to one another etc.

Figure 4:
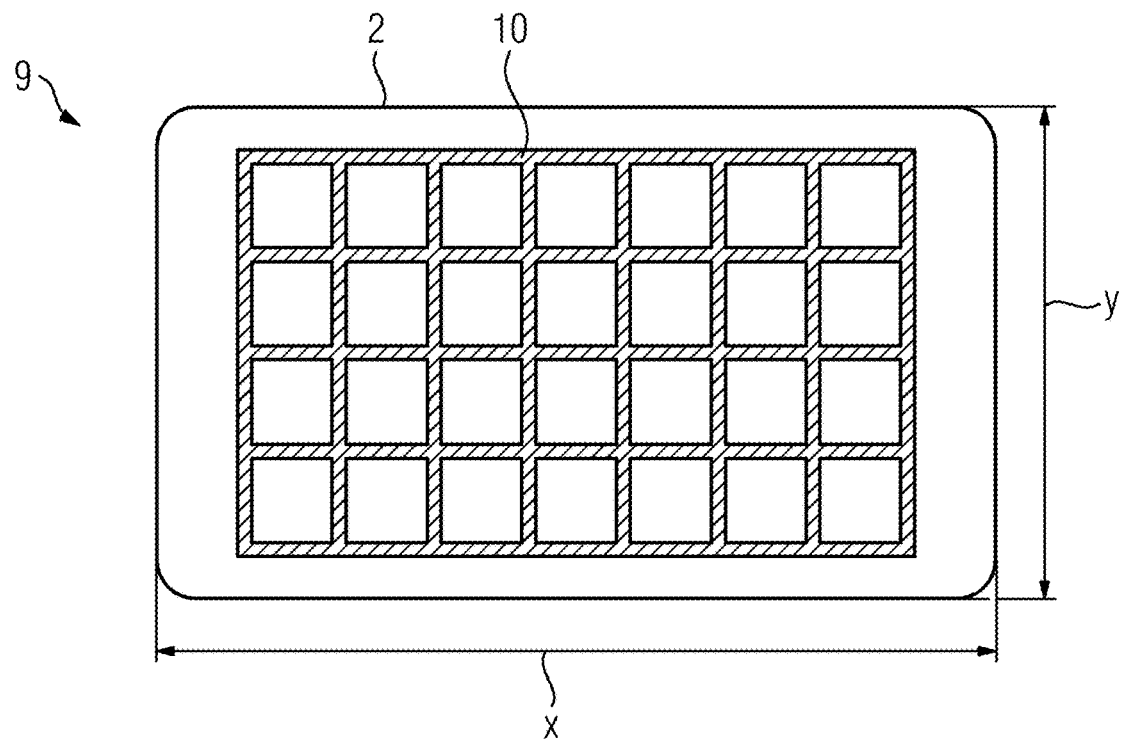
FIG. 4 shows a top view of a drawing of an MR surface coil 1 according to a third exemplary embodiment.

FIG. 4 shows a top view of a drawing of an MR surface coil 9 according to third exemplary embodiment. The MR surface coil 9 differs from the MR surface coils 1 and 8 by a grid-shaped stiffening device 5, which extends in both surface directions according to the x-axis and the y-axis. As a result, in the case of its stiffness, it is possible to restrict a flexibility of the MR surface coil 8 both about the x-axis and also about the y-axis.

Although the invention has been illustrated and described in detail by the exemplary embodiments shown, the invention is not restricted thereto, and other variations can be derived therefrom by a person skilled in the art without departing from the protective scope of the invention.

In general, a stiffening device can therefore be stiffened as a whole or only locally. Therefore in the presence of a stiffening volume, the entire stiffening material can be stiffened, or the stiffening material can only be stiffened locally at one or more points and otherwise remains flexible.

With the presence of a number of stiffening devices, these can also be stiffened selectively, i.e. optionally only one stiffening device, a number of stiffening devices or all stiffening devices are stiffened, namely in one development in each case as a whole or only locally.

In general, "a", "an", etc. can be understood as singular or plural, in particular in the sense of "at least one" or "one or more", etc., provided this is not explicitly excluded, e.g. by the expression "exactly one", etc.

The invention claimed is:

1. A mechanically flexible magnetic resonance (MR) surface coil comprising at least one adjustable stiffener integrated with the MR surface coil, wherein the stiffener has at least one stiffening volume comprising magnetorheological material, the at least one stiffening volume extending at least in one surface direction of the MR surface coil.

2. The mechanically flexible MR surface coil as claimed in claim 1, wherein the stiffener has at least one activatable magnetic field generator for generating a magnetic field at a site of the magnetorheological material for stiffening the stiffener.

3. The mechanically flexible MR surface coil as claimed in claim 1, wherein the stiffener is without an excitation element.

4. The mechanically flexible MR surface coil as claimed in claim 1, wherein the at least one adjustable stiffener as integrated with the MR surface coil has at least one stiffening volume comprising electrorheological material, which extends at least in one surface direction of the MR surface coil, and further comprising at least one voltage supply for applying an electric voltage at a site of the magnetorheological material for stiffening the stiffener.

5. The mechanically flexible MR surface coil as claimed in claim 1, wherein the at least one adjustable stiffener as integrated into the MR surface coil has at least one stiffening volume comprising thermorheological material, which extends at least in one surface direction of the MR surface coil.

6. The mechanically flexible MR surface coil as claimed in claim 5, wherein the stiffener has at least one heater for heating the thermorheological material for stiffening the stiffener.

7. The mechanically flexible MR surface coil as claimed in claim 5, wherein the stiffener is embodied without a heat source.

8. The mechanically flexible MR surface coil as claimed claim 1, wherein the stiffener has a plurality of fixed elements that are operable to move and lock into position relative to one another, wherein the fixed elements are operable to mechanically lock into position relative to one another by mechanical wedging.

9. The mechanically flexible MR surface coil as claimed in claim 1, wherein the stiffener has a plurality of fixed elements that are operable to move and lock into position relative to one another, wherein the fixed elements are magnets operable to displace relative to one another and lock into a position when a magnetic field is applied.

10. The mechanically flexible MR surface coil as claimed in claim 1, wherein the stiffener has a plurality of elements, which are operable to move relative to one another using actuators.

11. A mechanically flexible magnetic resonance (MR) surface coil comprising at least one adjustable stiffener integrated with the MR surface coil, wherein the stiffener has at least one stiffening volume comprising thermorheological material, the at least one stiffening volume extending at least in one surface direction of the MR surface coil, wherein, with a surface temperature of human skin, the thermorheological material has a noticeable stiffening compared with room temperature without use of a heat source other than the human skin.

12. A mechanically flexible magnetic resonance (MR) surface coil comprising at least one adjustable stiffener integrated with the MR surface coil, wherein the stiffener has at least one stiffening volume comprising magnetorheological material and/or thermorheological material, the at least one stiffening volume extending at least in one surface direction of the MR surface coil, wherein the stiffener has a plurality of elements operable to move and lock into position relative to each other in response to application of a magnetic field.

* * * * *